United States Patent
Kim et al.

(10) Patent No.: US 8,498,160 B2
(45) Date of Patent: Jul. 30, 2013

(54) NONVOLATILE MEMORY DEVICE AND RELATED PROGRAMMING METHOD USING SELECTIVE BIT LINE PRECHARGING

(75) Inventors: Bo Geun Kim, Hwaseong-si (KR); Ki tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 264 days.

(21) Appl. No.: 12/793,007

(22) Filed: Jun. 3, 2010

(65) Prior Publication Data

US 2011/0080791 A1  Apr. 7, 2011

(30) Foreign Application Priority Data

Oct. 5, 2009 (KR) .................... 10-2009-0094376

(51) Int. Cl.
*G11C 11/34* (2006.01)
(52) U.S. Cl.
USPC ............................... 365/185.22; 365/185.25
(58) Field of Classification Search
USPC ................................ 365/185.25, 203, 185.22
See application file for complete search history.

(56) References Cited

U.S. PATENT DOCUMENTS

| 6,373,748 B2 * | 4/2002 | Ikehashi et al. .......... 365/185.22 |
| 7,054,199 B2 | 5/2006 | Lee et al. |
| 2005/0117399 A1 * | 6/2005 | Kwon et al. ............. 365/185.28 |
| 2007/0025159 A1 * | 2/2007 | Lee et al. ................. 365/185.24 |
| 2008/0205163 A1 * | 8/2008 | Park et al. ................ 365/185.23 |
| 2009/0003072 A1 | 1/2009 | Hwang et al. |
| 2009/0141556 A1 * | 6/2009 | Baik ........................ 365/185.19 |
| 2009/0296465 A1 * | 12/2009 | Wang et al. ................ 365/185.2 |

FOREIGN PATENT DOCUMENTS

| JP | 2002109890 A | 4/2002 |
| JP | 2005243230 A | 9/2005 |
| KR | 1020050087264 A | 8/2005 |
| KR | 1020090000366 A | 1/2009 |

* cited by examiner

*Primary Examiner* — Vanthu Nguyen
*Assistant Examiner* — Khamdan Alrobaie
(74) *Attorney, Agent, or Firm* — Volentine & Whitt, PLLC

(57) ABSTRACT

A method of programming a nonvolatile memory device comprises programming memory cells by performing a plurality of program loops with bitline precharging inactivated during program verification operations of some of the program loops, and with bitline precharging activated during program verification operations of some of the program loops.

19 Claims, 14 Drawing Sheets

US 8,498,160 B2

NONVOLATILE MEMORY DEVICE AND RELATED PROGRAMMING METHOD USING SELECTIVE BIT LINE PRECHARGING

CROSS-REFERENCE TO RELATED APPLICATIONS

This application claims priority under 35 U.S.C. §119 to Korean Patent Application No. 10-2009-0094376 filed on Oct. 5, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile semiconductor memory devices and related methods of operation.

Semiconductor memory devices can be roughly divided into two categories including volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

Flash memory is a form of nonvolatile memory known for having relatively high programming speed, low power consumption, and high storage capacity. Consequently, flash memory has been adopted as a storage medium in a wide variety of electronic devices.

To increase the integration density and storage capacity of flash memory devices, researchers have developed flash memory cells capable of storing more than one bit of data. A flash memory cell storing one bit of data is called a single level cell (SLC) and a flash memory cell storing two or more bits per memory cell is called a multi-level cell (MLC). An SLC typically has two states corresponding to two different threshold voltage distributions. These states include an erased state and a programmed state. A multi-level cell typically has additional states corresponding to additional threshold voltage distributions.

In a flash memory having MLCs (hereinafter, an MLC flash memory), different threshold voltage distributions should be separated by sufficient margins to allow the corresponding states to be distinguished from each other during read operations.

SUMMARY

Embodiments of the inventive concept provide nonvolatile memory devices and related methods of operation. In some embodiments, a programming operation is performed in a nonvolatile memory device by performing a plurality of program loops with bitline precharging inactivated during program verification operations of some of the program loops, and with bitline precharging activated during program verification operations of some of the program loops.

According to one embodiment of the inventive concept, a method of programming a nonvolatile memory device comprises performing a plurality of program loops on a selected page of memory cells, wherein each of the program loops comprises applying a program pulse to a selected wordline connected to the selected page, and performing a program verification operation during at least one of the program loops, wherein at least one of the program verification operations comprises precharging selected bitlines and sensing voltage changes on the selected bitlines while applying a verification voltage to the selected wordline. At least one of the program loops is performed without precharging the selected bitlines.

In certain embodiments, the program pulses increase in magnitude with successive program loops. In certain embodiments, the program pulses decrease in magnitude with successive program loops. In certain embodiments, at least one of the program verification operations comprises applying a verification voltage to the selected wordline without precharging the selected bitlines.

In certain embodiments, the selected memory cells are programmed from an initial program state to an intermediate program state by program loops without bitline precharging, and are programmed from the intermediate program state to a final program state by program loops with bitline precharging.

In certain embodiments, the intermediate state is a state where a magnitude of drain-source currents of the selected memory cells of is below a predetermined threshold value. In certain embodiments, the intermediate state is achieved by performing a predetermined number of program loops in accordance with a loop count value. In certain embodiments, the intermediate state is a state where a common source line connected to the selected memory cells has a current with a magnitude smaller than a predetermined value.

In certain embodiments, the nonvolatile memory device is a multi-level cell flash memory device.

According to another embodiment of the inventive concept, a nonvolatile memory device comprises a memory cell, a page buffer connected to a bitline of the memory cell, and control logic configured to inactivate precharging of the bitline during a program verification operation performed while a loop count stored in the page buffer is below a predetermined value, and further configured to activate precharging of the bitline during a program verification operation performed while the loop count stored in the page buffer is at or above the predetermined value.

In certain embodiments, the page buffer comprises a plurality of latches to store the loop count. In certain embodiments, the control logic controls the plurality of latches to increment the loop count in successive program loops of the nonvolatile memory device.

In certain embodiments, the nonvolatile memory device further comprises a loop count circuit generating the loop count.

In certain embodiments, the nonvolatile memory device further comprises a decoder transmitting a program voltage or a verification voltage to a wordline of the memory cell.

In certain embodiments, the control logic controls the decoder to cut off the verification voltage from the wordline during program verification operations performed while the loop count is below the predetermined value.

According to another embodiment of the inventive concept, a method of programming a nonvolatile memory device comprises selecting a programming mode of the nonvolatile memory device based on received input data. Where the selected programming mode is a first programming mode, a plurality of program loops are performed to program a selected page of memory cells, wherein each of the program loops comprises a program verification operation performed with bitline precharging. Where the selected programming mode is a second programming mode, a plurality of program loops are performed to program the selected page of memory cells, wherein some of the program loops comprise a program verification operation performed with bitline precharging and some of the program loops are performed without bitline precharging.

In certain embodiments, the input data comprises a page of data to be programmed in the selected page of memory cells. In certain embodiments, selecting the programming mode comprises determining the number of bits with logic level '1' in the input data, and selecting the first programming mode where the determined number exceeds a predetermined value. In certain embodiments, storing meta-data in the selected page of memory cells to indicate the selected programming mode. In certain embodiments, the nonvolatile memory device comprises a multi-level cell flash memory device.

BRIEF DESCRIPTION OF THE DRAWINGS

Embodiments of the inventive concept are described below with reference to the accompanying drawings. In the drawings, like reference numbers denote like features.

DETAILED DESCRIPTION OF THE EMBODIMENTS

Selected embodiments of the inventive concept are described below with reference to the accompanying drawings. These embodiments are provided as teaching examples and should not be interpreted to limit the scope of the inventive concept as defined by the claims.

Figure 1:
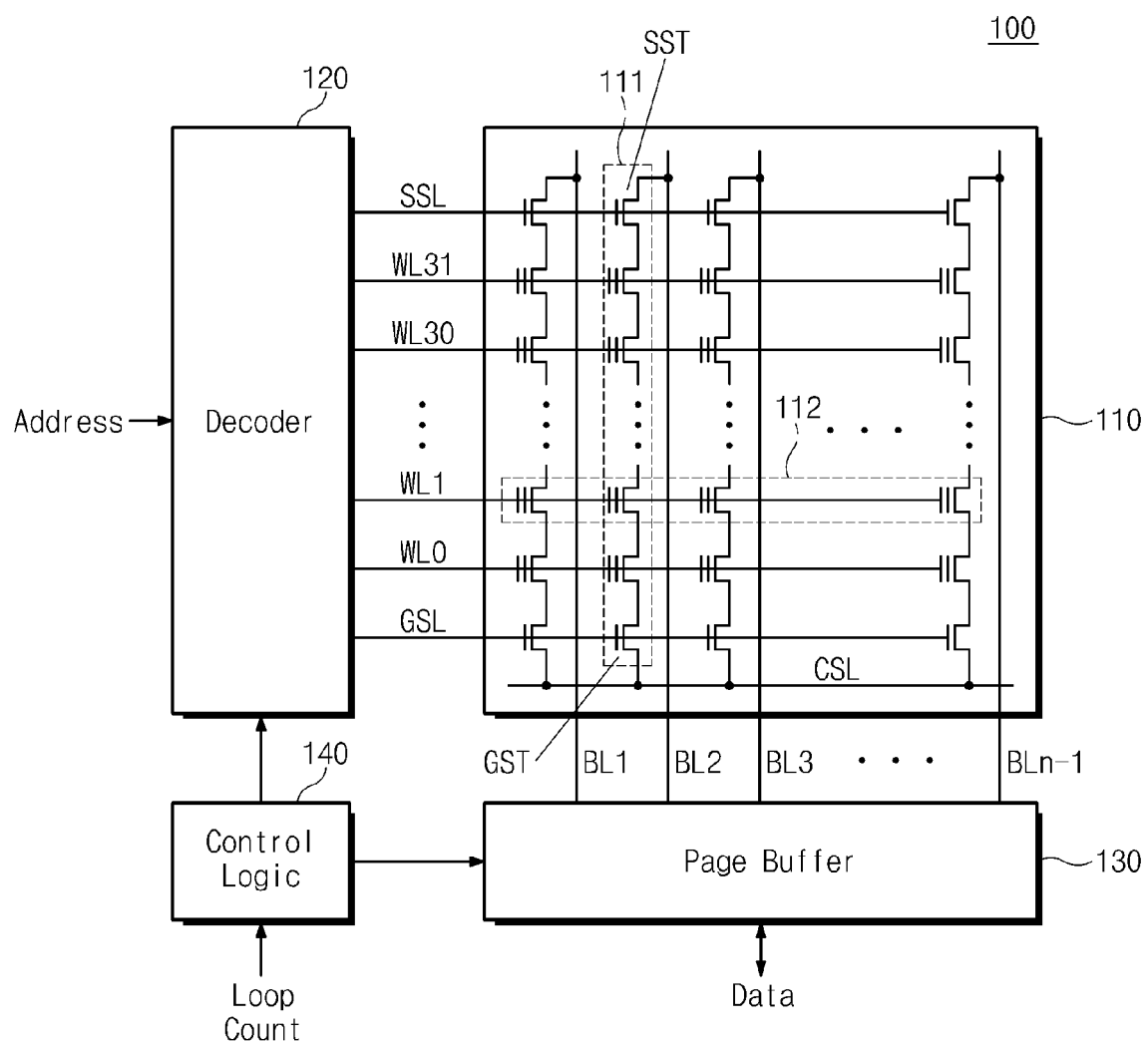
FIG. 1 is a block diagram illustrating a nonvolatile memory device in accordance with an embodiment of the inventive concept.

FIG. 1 is a block diagram illustrating a nonvolatile memory device 100 in accordance with an embodiment of the inventive concept. Referring to FIG. 1, nonvolatile memory device 100 comprises a cell array 110, a decoder 120, a page buffer 130 and control logic 140.

Cell array 110 comprises a plurality of memory blocks, and FIG. 1 shows one example memory block. Each of memory blocks comprises a plurality of pages, and each page comprises a plurality of memory cells. In nonvolatile memory device 100, erase operations are performed on memory block units and program and read operations are performed on page units.

Cell array 110 comprises a plurality of cell strings. An example cell string 111 is indicated by a dotted box in FIG. 1, and other cell strings in cell array 110 have a similar structure. Cell string 111 comprises a string select transistor SST connected to a string select line SSL, a plurality of memory cells connected to a plurality of wordlines WL0-WL31, and a ground select transistor GST connected to a ground select line GSL. String select transistor SST is connected to a bitline BL2 and ground select transistor GST is connected to a common source line CSL.

A plurality of memory cells are connected to each wordline of cell array 110. A collection of memory cells connected to one wordline and simultaneously programmed is called a page. For example, a page 112 comprises memory cells connected to a wordline WL1. The memory cells of page 112 are programmed simultaneously by applying appropriate voltages to corresponding bitlines based on received program data and applying a program voltage Vpgm and a program verification voltage to wordline WL1.

During a program operation, the program data is provided to bitlines connected to selected page 112 and program voltage Vpgm is applied to wordline WL1. In a program verification operation, which typically forms part of the program operation, bitlines connected to the memory cells of selected page 112 are precharged, the program verification voltage is applied to wordline WL1, and voltage changes of the precharged bitlines are sensed. The change in the precharged bitline is used to determine whether the memory cells have been successfully programmed.

Decoder 120 is connected to cell array 110 through select lines SSL and GSL and wordlines WL0-WL31. In a program or read operation, decoder 120 receives an address and selects a corresponding wordline (e.g., WL1). Decoder 120 generates voltages required by a read operation or a program operation to the selected wordline and unselected wordlines.

Page buffer 130 is connected to cell array 110 via bitlines BL1-BLn. Page buffer 130 receives data and transfers data to selected page 112 in a program operation. Page buffer 130 reads data from selected page 112 and outputs the data to an external destination.

Page buffer 130 temporarily stores data to be programmed in selected page 112 or data read from selected page 112. Page buffer 130 transfers program the stored data to bitlines BL1-BLn in a program operation and senses memory cells in selected page 112 through bitlines BL1-BLn in a program verification operation. Page buffer 130 precharges bitlines to perform a program verification operation. Page buffer 130 then senses a voltage change of the precharged bitlines BL1-BLn while the verification voltage is applied to wordline WL1 to determine whether memory cells included in selected page 112 are programmed or not.

As will be described in further detail below, the program verification operation is typically performed as part of a program loop in an incremental step pulse programming (ISPP) scheme. In certain embodiments, however, the program verification operation is skipped in one or more program loops of the ISPP scheme. Additionally, a precharge operation of a bitline may be skipped in a verification operation of one or more of the program loops.

Control logic 140 can control operations of nonvolatile memory device 100 such as program, read, and erase operations. For example, in a program operation, control logic 140 can control decoder 120 so that a program voltage is provided to the selected wordline. Control logic 140 can control page buffer 130 so that program data is provided to selected page 112.

Control logic 140 can determine whether to precharge bitlines of page 112 in a particular program loop based on a program loop count. For instance, control logic 140 can control page buffer 130 so that bitlines BL1-BLn-1 are not precharged in a verification operation of a specific loop, and then it can control page buffer 130 to precharge the bitlines in remaining program loops and to sense voltage changes on the precharged bitlines.

As indicated above, in certain embodiments, nonvolatile memory device 100 omits a precharge operation of selected bitlines during a verification operation in certain program loops, but performs precharge operations in other program loops. Changes in voltages of the precharged bitlines can then be used to determine whether corresponding memory cells have been successfully programmed.

Figure 2:
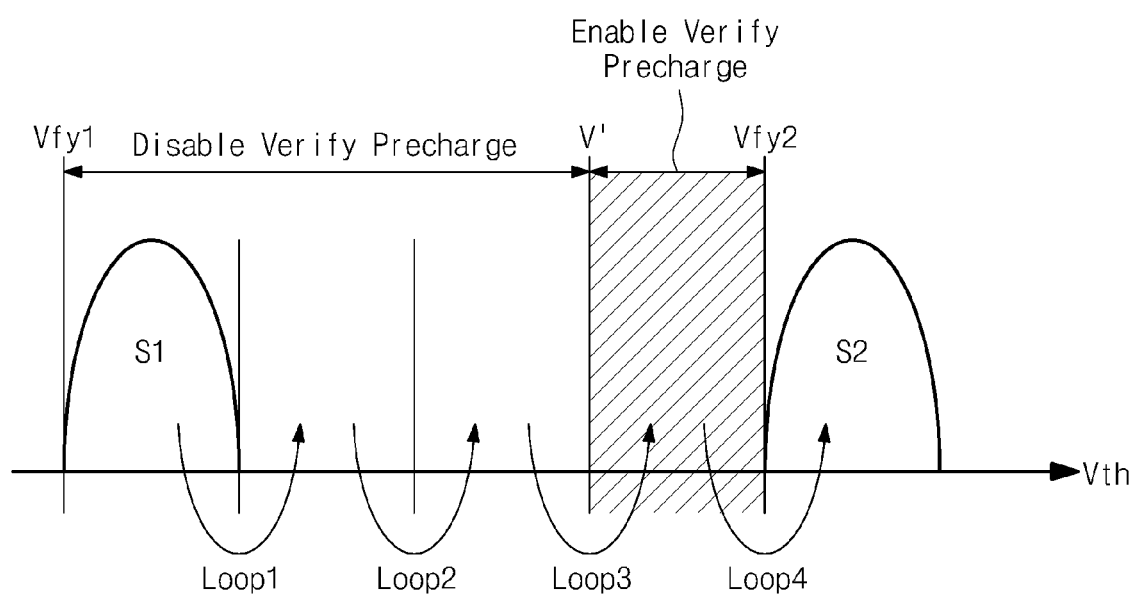
FIG. 2 is a threshold voltage diagram illustrating a method of programming a nonvolatile memory device in accordance with an embodiment of the inventive concept.

FIG. 2 is a threshold voltage diagram illustrating a program operation of nonvolatile memory device 100 according an embodiment of the inventive concept. Referring to FIG. 2, memory cells in nonvolatile memory device 100 can be programmed to one of a plurality of states by modifying their threshold voltages. In the embodiment of FIG. 2, a memory cell is programmed from a state S1 corresponding to a leftmost threshold voltage distribution to a state S2 corresponding to a right-most threshold voltage distribution.

The threshold voltage distribution of state S1 is delimited by a first verification voltage Vfy1, and the threshold voltage distribution of state S2 is delimited by a second verification voltage Vfy2. Where a memory cell is programmed from state S1 to state S2, a program voltage Vpgm and second verification voltage Vfy2 are alternately applied to the gate of the selected memory cell. Together, the step of applying a pulse of program voltage Vpgm, followed by a program verification operation, constitute a program loop. Typically, the magnitude of program voltage Vpgm is incremented in successive program loops of a program operation. A program operation typically ends once a program verification operation determines that the threshold voltage of a memory cell or memory cells is within a desired threshold voltage distribution or distributions.

The following is one example of a program verification operation. First, a bitline is precharged. Then, a verification voltage (e.g., second verification voltage Vfy2) is applied to a wordline. The selected memory cell may be turned on or off by the verification voltage applied to the wordline. If the memory cell turns on in response to the verification voltage, it is considered a failed cell, i.e., a cell that is inadequately programmed. If the memory cell remains off in the presence of the verification voltage, the memory cell is considered to be a passed cell, i.e., a memory cell that has been successfully programmed to a target state. The failed cell and the passed cell can be distinguished through a voltage change of a precharged bitline.

Where memory cells are programmed from state S1 to state S2 using a programming method in accordance with certain embodiments of the inventive concept, bitline precharging for a program verification operation is performed only in some program loops. In the example of FIG. 2, it will be assumed that memory cells are programmed from state S1 to state S2 through four program loops, denoted by curved arrows. In this embodiment, selected bitlines are precharged only in a verification operation performed in a fourth loop Loop4, as indicated by a shaded region. The bitlines are not precharged in a verification operation performed in other loops of the program operation.

In a program verification operation of nonvolatile memory device 100, bitline precharging is performed only in program loops where threshold voltages of selected memory cells are relatively close to target stage S2, such as where they exceed a certain base voltage V' shown in FIG. 2. One potential benefit of omitting bitline precharging in some program loops relates to the fact that each cell string in cell array 110 is connected to common source line CSL, which has a resistance. In a program verification operation, the electric potentials at source terminals of the selected memory cells sources tend to differ due to the resistance of common source line CSL. These differences can cause memory cells in the same page to respond differently to the same verification voltage. Where the memory cells are programmed to target state S2 in the presence of these differences, the threshold voltage distribution of target state S2 may be undesirably wide, decreasing a sensing margin between states S1 and S2.

To address the above issue, selected embodiments of the inventive concept precharge a bitline only in certain verification operations to minimize a voltage rise due to the resistance of common source line CSL. For instance, in the embodiment of FIG. 2, bitlines of selected memory cells are precharged during verification operations only where the threshold voltages of the selected memory cells exceed base voltage V'. Alternatively, precharging of the bitlines can be performed during verification operations in a specific number of loops of a program operation.

Figure 3:
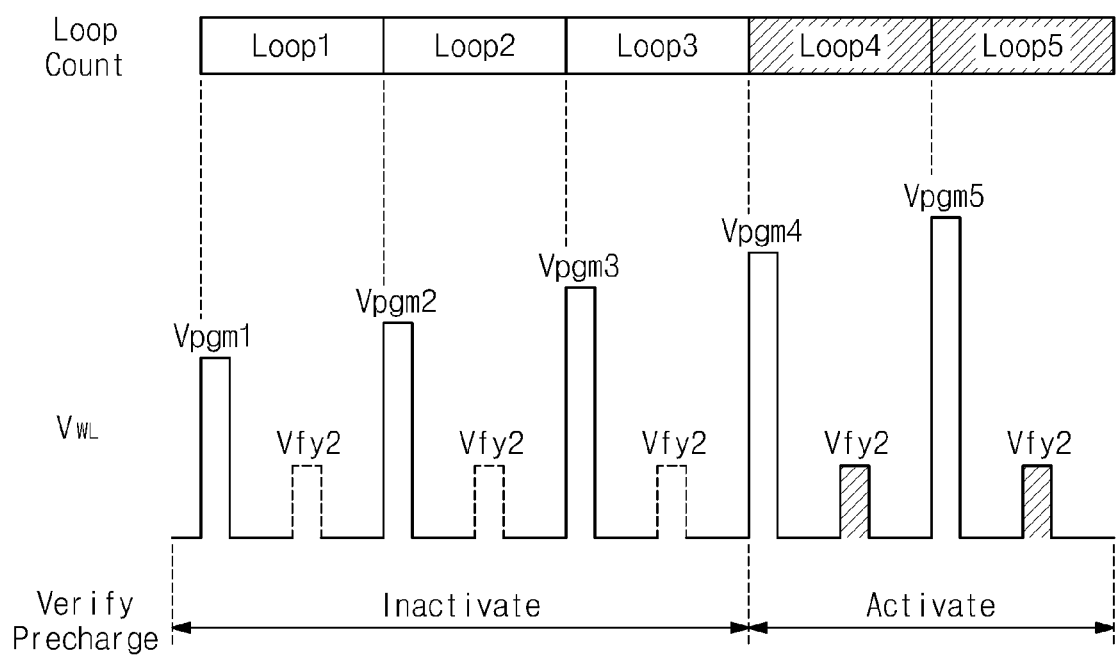
FIG. 3 is a timing diagram illustrating a wordline voltage during a program operation of a nonvolatile memory device.

FIG. 3 is a timing diagram illustrating different values of wordline voltage $V_{WL}$ applied to the selected wordline WL1 during a program operation. Wordline voltage $V_{WL}$ comprises program pulses with magnitudes Vpgm1 through Vpgm5, and a verify voltage with a magnitude Vfy2. The program pulses will be referred to as program voltage Vpgm and the verification voltage will be referred to as a verification voltage Vfy2.

The program operation uses incrementally increasing values of program voltage Vpgm, alternating with verification voltage Vfy2 is an ISPP operation. As indicated by the upper labels in FIG. 3, each pulse of program voltage Vpgm and a corresponding pulse of verification voltage Vfy2 constitute a program loop. In total, FIG. 3 shows first through fifth program loops Loop1, Loop2, Loop3, Loop4, and Loop5.

In the embodiment of FIG. 3, program voltage Vpgm is used to program the selected memory cells to target state S2 of FIG. 2. Although program voltage Vpgm is incremented in each successive loop of FIG. 3, in alternative embodiments, program voltage Vpgm could maintain a specific value or decrease with successive loops.

In the first through third loops Loop1-Loop3, a verification operation is performed without precharging a bitline. In contrast, in the fourth and fifth loops Loop4 and Loop5, verification operations are performed with bitline precharging. In other words, in the first through third loops, bitline precharging is inactivated, and in the fourth and fifth loops, bitline precharging is activated.

In some embodiments, the number of loops where bitline precharging is inactivated is based on a prediction or estimation of how many loops are required to achieve threshold voltages close to target state S2. Such predictions or estimations can be based on ISPP parameters, such as the respective magnitudes of the program pulses, verification voltages, or the respective widths of threshold voltage distributions of the selected memory cells. Based on this or other information, it is possible to generate an estimation or prediction of the number of loops required to achieve threshold voltages in the selected memory cells close to target voltage S2.

Various modifications can be made to the embodiment of FIG. 3. For instance, in some alternative embodiments, a bitline precharge operation as well as application of a verification voltage can be omitted in the first through third loops, or additional loops.

Figure 4:
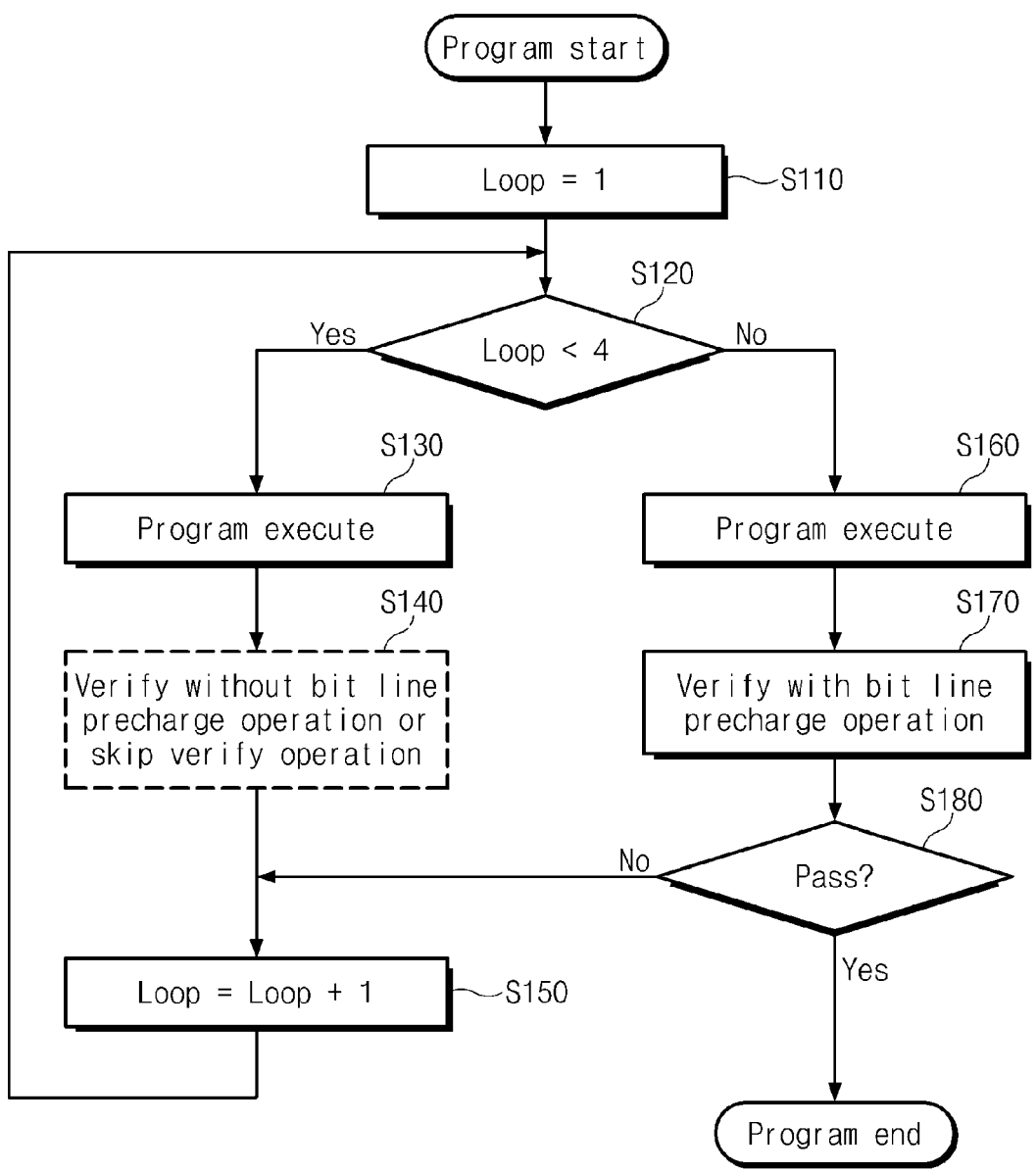
FIG. 4 is a flow chart illustrating a method of programming a nonvolatile memory device in accordance with an embodiment of the inventive concept.

FIG. 4 is a flow chart illustrating a method of programming nonvolatile memory device 100 in accordance with an embodiment of the inventive concept. In the description that follows, example method steps will be denoted by parentheses (SXXX).

The method of FIG. 4 comprises multiple program loops tracked by a loop counter stored in control logic 140. In a first program loop, the loop counter is initialized to loop=1 (S110). Thereafter, control logic 140 determines whether the loop counter has reached a base value (S120). Here, the base value (for example, 4) is a loop count value used to determine whether a bitline is precharged in a verification operation. The base value is a prediction or estimation of the number of program loops required to elevate the threshold voltages of selected memory cells to a level higher than base voltage V'. Where the loop counter is smaller than the base value 4 (S120=Yes), the method advances to a program execution step in which a program pulse is applied to the selected memory cells (S130), followed by a verification operation performed without bitline precharging (S140), followed by a step to increment the loop counter (S150), and a return to step S120. Otherwise (S120=No), where the loop counter is greater than the base value 4, the method advances to a program execution step in which a program pulse is applied to the selected memory cells (S160), followed by a verification operation performed with bitline precharging (S170).

In steps S130 and S160, a program voltage Vpgm is applied to a selected wordline (e.g., WL1). During the application of program voltage Vpgm, a bitline program voltage (about 0V) or a bitline program prohibition voltage Vcc is provided to bitlines of the selected memory cells. The bitline program voltage or the bitline program prohibit voltage applied to the bitlines is determined by program data loaded in page buffer 130.

In step S170, control logic 140 precharges a bitline and executes a verification operation that provides verification voltage Vfy2 to the selected wordline. Because the loop counter has exceeded the base value, threshold voltages of the selected memory cells are deemed to be close to target state S2. Accordingly, the magnitudes of currents flowing through the sources of failed cells among the selected memory cells selected by verification voltage Vfy2 are likely to be relatively small, and the current flowing in common source line CSL is also likely to be relatively small. As a result, bouncing of a source voltage of the selected memory cells due to resistance in common source line CSL can be reduced.

After step S170, the method determines whether all of the selected memory cells have been successfully programmed (S180). Where one or more of the selected memory cells is not successfully programmed (S180=No), the loop counter is incremented (S150) and the method returns to step S120.

Where all of the selected memory cells are successfully programmed (S180=Yes), the program operation is complete.

Figure 5:
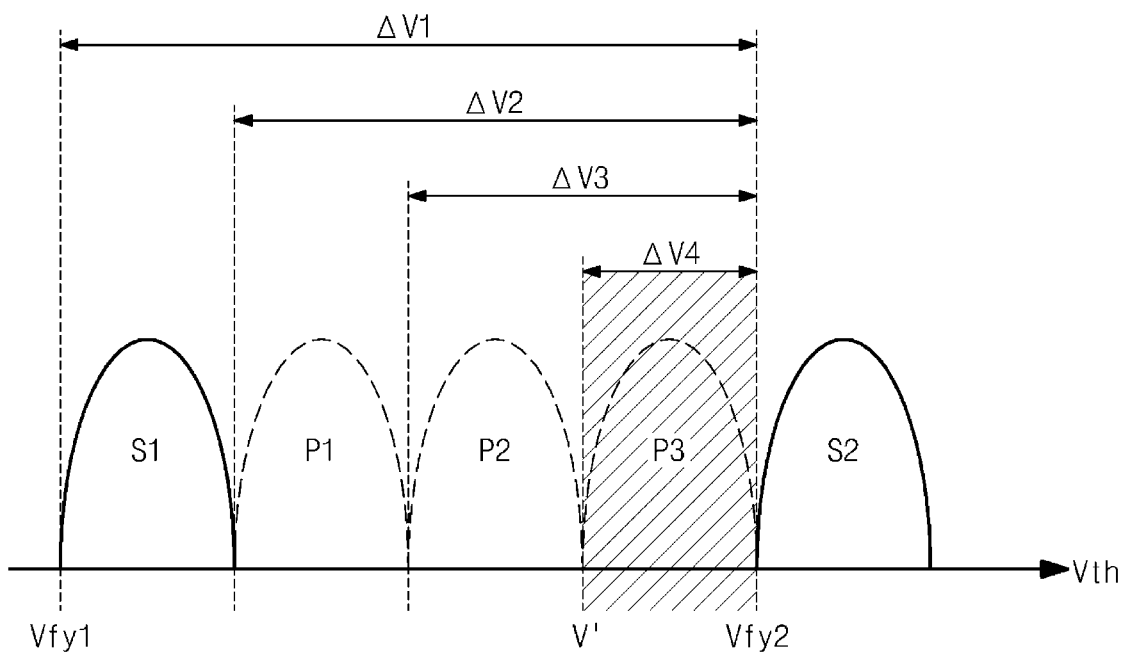
FIG. 5 is a threshold voltage diagram illustrating an effect associated with certain embodiments of the inventive concept.

FIG. 5 is a threshold voltage diagram illustrating different threshold voltages of selected memory cells in a nonvolatile memory device. In FIG. 5, threshold voltage distributions represented by dotted lines correspond to successive loops of a program operation. In particular, a threshold voltage distribution corresponding to a program state P1 is achieved after a first program loop, a threshold voltage distribution corresponding to a program state P2 is achieved after a second program loop, and so on.

A threshold voltage distribution corresponding to a state 51 represents an initial state of selected memory cells before programming. The threshold voltages of memory cells in state 51 have a minimum difference of ΔV2 from verification voltage Vfy2, and a maximum difference of ΔV1 from verification voltage Vfy2. Where a memory cell in state 51 has a precharged bitline and receives verification voltage Vfy2 on its control gate, a relatively large current flows through the channel of the selected memory cell. Accordingly, bitline precharging is inactivated until the threshold voltages of selected memory cells reach program state P3. Threshold voltages of memory cells in state P1 have a voltage difference of ΔV3 to ΔV2 from verification voltage Vfy2. Threshold voltages of memory cells in state P2 have a voltage difference of ΔV4 to ΔV3 from verification voltage Vfy2.

As the number of executed program loops increases, the threshold voltages of selected memory cells increase accordingly. Threshold voltages of memory cells in state P3 have a voltage difference of ΔV4 to 0 from verification voltage Vfy2. Thus, where a verification operation is performed on selected memory cells in state P3, channel currents of those cells is relatively small compared with the channel currents of selected memory cells in states S1, P1, P2 and P3. After threshold voltages of the selected memory cells achieve state P3, which is relatively close to target state S2, bitline precharging is activated for the selected memory cells.

Current flowing through selected memory cells causes common source line CSL noise during program operations. Thus, minimizing the number of loops where a bitline is precharged during verification operations can reduce programming errors.

Figure 6A:
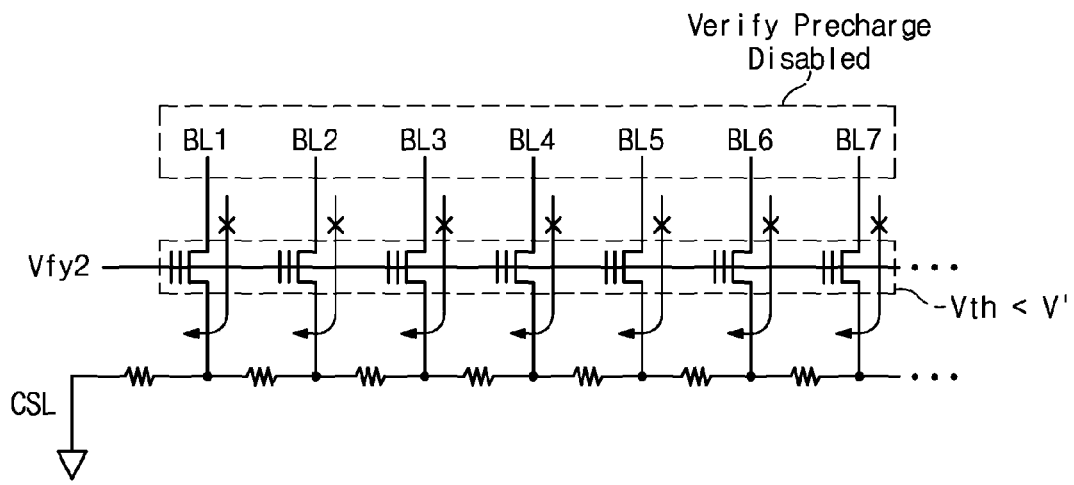
FIGS. 6A and 6B are circuit diagrams illustrating a program verification operation of a nonvolatile memory cell in accordance with an embodiment of the inventive concept.
Figure 6B:
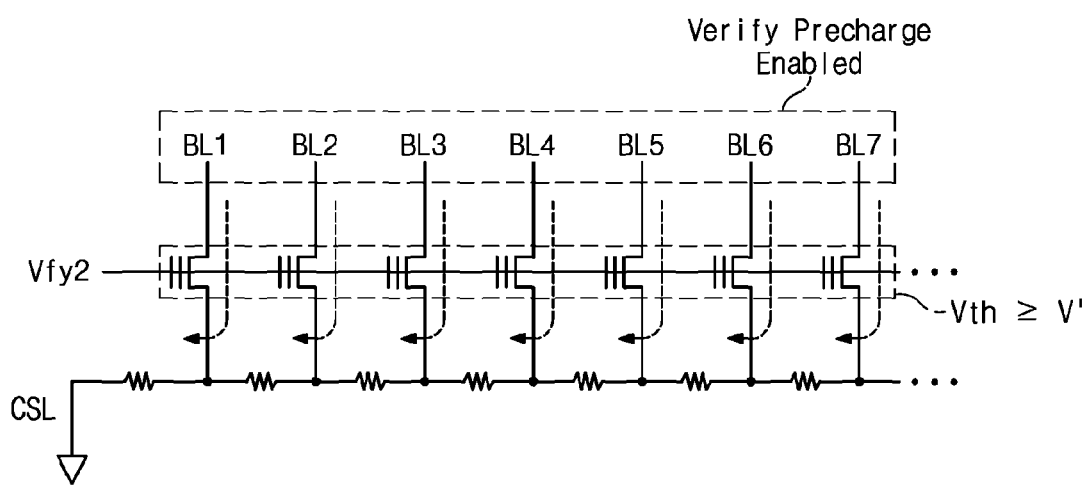

FIGS. 6A and 6B are circuits illustrating bitline currents during verification operations performed in program operations of a nonvolatile memory device. FIG. 6A illustrates bitline currents of selected memory cells during a verification operation where threshold voltages of selected memory cells are lower than base voltage V'. FIG. 6B illustrates bitline currents of selected memory cells during a verification operation where threshold voltages of selected memory cells are greater than or equal to base voltage V'.

Referring to FIG. 6A, threshold voltages of the selected memory cells are lower than base voltage V'. Thus, precharging of bitlines BL1 through BL7 is omitted during verification operations of the selected memory cells. Where verification voltage Vfy2 is provided to a wordline of the selected memory cells, the selected memory cells are turned on. However, bitlines BL1 through BL7 are not precharged and therefore the drain voltages of the selected memory cells are not high enough to produce a significant amount of current. In other words, even where the selected memory cells are turned on, a current between a bitline (or drain) and a source is typically small enough to be ignored. Thus, current flowing in common source line CSL becomes also small enough to be ignored.

Referring to FIG. 6B, threshold voltages of the selected memory cells are greater than or equal to base voltage V'.

Thus, when a verification operation is performed, precharging of bitlines BL1 through BL7 is activated. After the bitlines are precharged, verification voltage Vfy2 is provided to a wordline of the selected memory cells. The selected memory cells may or may not be turned on by verification voltage Vfy2 depending on their respective threshold voltages. Current flows through the respective channels of selected memory cells that are turned on. That is, precharged bitline are discharged to the sources of the selected memory cells and current flows in common source line CSL.

In the examples of FIG. 6, bitline precharging is inactivated during program verification operations where the threshold voltages of selected memory cells are lower than base voltage V'. Consequently, common source line CSL is prevented from bouncing, which prevents the threshold voltage distributions of programmed memory cells from being undesirably wide. In other words, inactivation of bitline precharging during verification operations prevents program operations from producing overly wide threshold voltage distributions.

Figure 7:
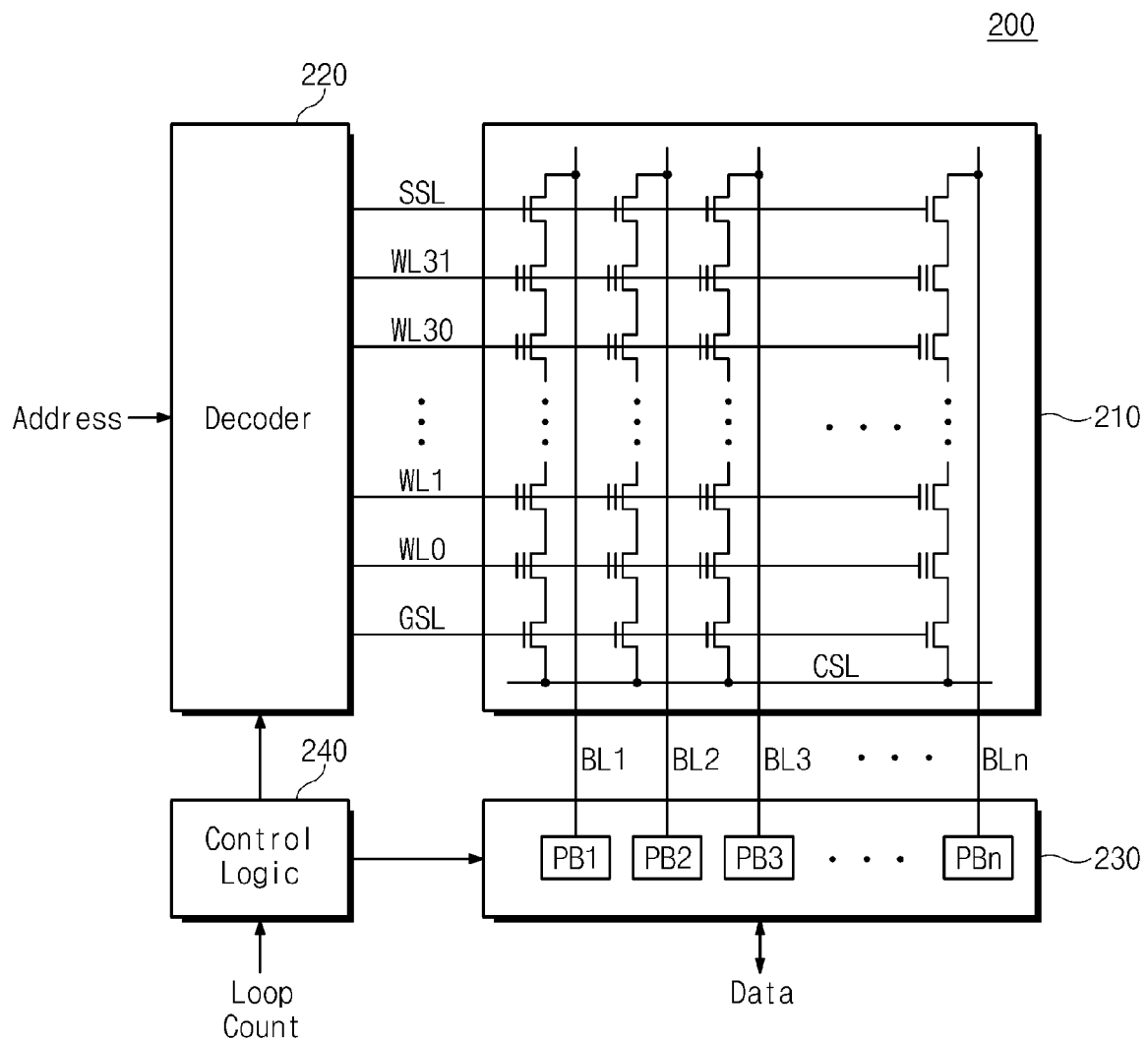
FIG. 7 is a block diagram illustrating a nonvolatile memory device in accordance with another embodiment of the inventive concept.

FIG. 7 is a block diagram illustrating a nonvolatile memory device 200 in accordance with another embodiment of the inventive concept. Referring to FIG. 7, nonvolatile memory device 200 comprises a cell array 210, a decoder 220, a page buffer 230 and control logic 240. Cell array 210 and decoder 220 are similar to cell array 110 and decoder 120 and therefore a detailed description of these elements will be omitted to avoid redundancy.

Page buffer 230 is connected to cell array 210 via bitlines BL1 through BLn. In a program operation, page buffer 230 receives data from an external source and transfers the program data to a selected page. In a read operation, page buffer 230 reads data from the selected page and outputs the data to an external destination.

Page buffer 230 temporarily stores data to be programmed in the selected page or data read from the selected page. In a program operation, page buffer 230 transfers program data to bitlines BL1 through BLn. In a program verification operation, page buffer 230 senses the selected page through bitlines BL1 through BLn. The sensed result is used to determine whether the selected page has been successfully programmed.

Page buffer 230 precharges bitlines BL1 through BLn to sense the memory cells efficiently. Page buffer 230 senses a change of a voltage of precharged bitlines BL1 through BLn to determine whether or not memory cells in the selected page are programmed. In certain embodiments, page buffer 230 skips a program verification operation of some program loops according to a program operation mode. In other loops, page buffer 230 performs program verification operations with bitline precharging activated.

Page buffer 230 comprises page buffer units PB1, PB2 . . . , PBn each comprising a plurality of latches. Each of the plurality of latches stores program data to be transferred to a corresponding bitline. Some of the latches store program data received from an external source, and some of the latches sense and store bitline voltage changes in program verification operations. A page buffer unit in an MLC device typically comprises latches capable of storing multiple bits.

Page buffer units PB1, PB2 . . . , PBn typically further comprise a count latch to store a loop count value. The loop count value is incremented in successive program loops of nonvolatile memory device 200. In verification operations where the loop count value is less than the base value, bitline precharging is inactivated. In verification operations where the loop count value is greater than or equal to the base value, bitline precharging is activated. An example embodiment of the count latch will be described in FIG. 8.

Control logic 240 controls operations of nonvolatile memory device 200 such as program, read, and erase operations. For example, in a program operation, control logic 240 controls decoder 220 to apply a program voltage to the selected wordline and controls page buffer 230 to provide program data to the selected page.

Control logic 240 stores the loop count value in a count latch of each of page buffer units PB1, PB2 . . . , PBn and controls page buffer 230 to update the loop count value during each program loop of a program operation. In certain embodiments, control logic 240 sets the loop count value in each count latch. The inventive concept, however, is not limited to this manner of setting the loop count value. For instance, in certain embodiments, the loop count value is set by another element or by data received from an external source.

As indicated by the above description, nonvolatile memory device 200 does not perform bitline precharging during verification operations in certain program loops, but does perform bitline precharging during verification operations in other program loops. In the verification operations where bitline precharging is performed, nonvolatile memory device 200 detects whether a selected memory cells has been successfully programmed by detecting voltage changes on the precharged bitlines.

Figure 8:
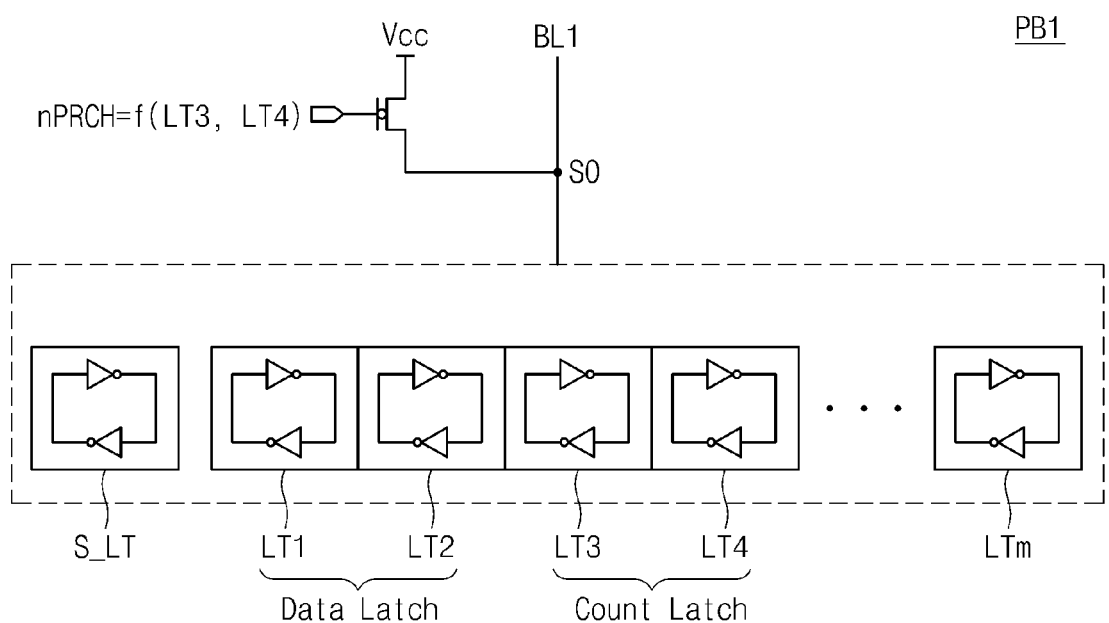
FIG. 8 is a block diagram illustrating an embodiment of a page buffer illustrated in FIG. 7.

FIG. 8 is a block diagram illustrating an embodiment page buffer unit PB1 of FIG. 7. In particular, FIG. 8 illustrates latches within an embodiment of page buffer unit PB1. Other page buffer PB2 through PBn are similar to page buffer unit PB1, and therefore further explanation of the other page buffers will be omitted to avoid redundancy.

Page buffer unit PB1 comprises a plurality of latches. In a verification operation, a sensing latch S_LT senses and stores a voltage change of a sensing node SO connected to bitline BL1. In a program operation, a latch LT1 transfers program data to bitline BL1 and a latch LT2 stores program data received from an external source. Latches LT1 and LT2 are referred to as data latches.

Latches LT3 and LT4 store the loop count value and are referred to as a count latch. Where the stored loop count value reaches a specific value, a precharge control signal nPRCH becomes activated. The activation of precharge control signal nPRCH is typically controlled by a combination circuit that combines the bit values stored in the count latches to determine the activation state of precharge control signal nPRCH.

Figure 9:
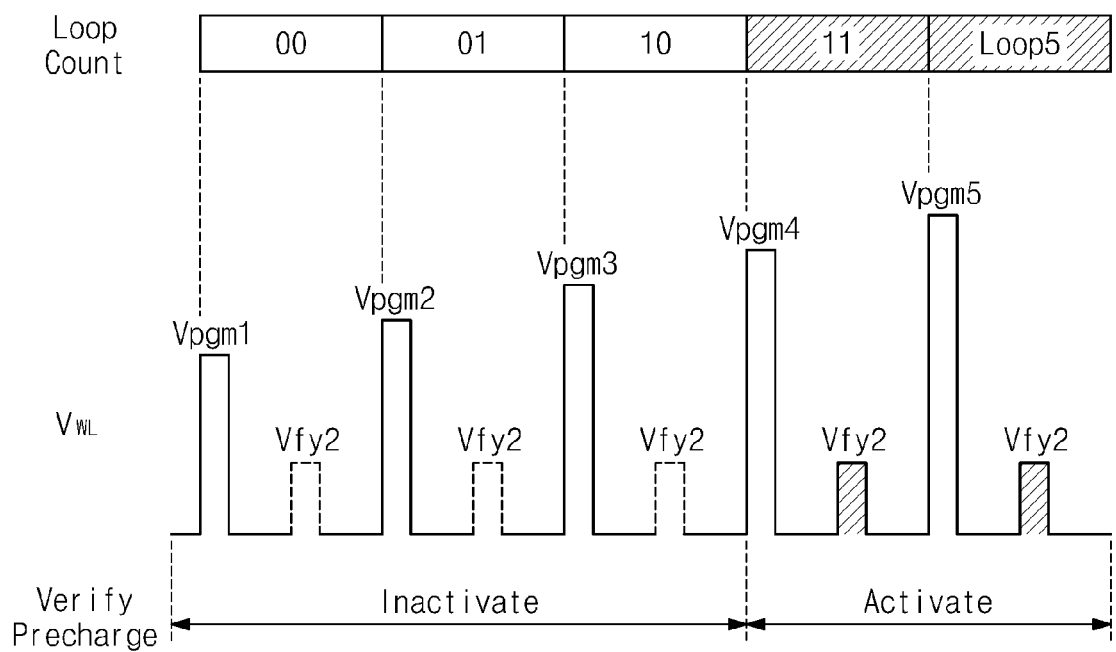
FIG. 9 is a timing diagram illustrating the operation of the nonvolatile memory device of FIG. 7.

FIG. 9 is a timing diagram illustrating the operation of nonvolatile memory device 200 of FIG. 7. A program voltage Vpgm is used to program selected memory cells to state S2 illustrated in FIG. 2. Nonvolatile memory device 200 typically increases program voltage Vpgm in successive program loops using an ISPP scheme. Alternatively, nonvolatile memory device 200 can maintain program voltage Vpgm at a uniform level or gradually reduce program voltage Vpgm in successive program loops.

In the embodiment of FIG. 9, bitline precharging is inactivated in program verification operations of certain program loops, and activated in program verification operations of other program loops. The inactivation or activation of the bitline precharging is based on a loop count stored as a two bit number in page buffer 230. The loop count is shown at the top of FIG. 9.

In a first program loop '00', a program voltage Vpgm1 and a verification voltage Vfy2 are applied to a selected wordline. In a second loop '01', a program voltage Vpgm2 and verification voltage Vfy2 are applied to the selected wordline. In a third loop '10', a program voltage Vpgm3 and verification voltage Vfy2 are applied to the selected wordline. In a fourth loop '11', a program voltage Vpgm4 and verification voltage Vfy2 are applied to the selected wordline. Finally, in a fifth loop Loop5, a program voltage Vpgm5 and verification voltage Vfy2 are applied to the selected wordline.

Bitline precharging is inactivated in program verification operations of loop '00' through loop '10', and activated in program verification operations of loops '11' and Loop5. In some embodiments, the supply of verification voltage Vfy2 may also be omitted from loops '00' through loop '10'. In addition, in some embodiments, the bitline inactivation and/or program verification operations may be applied in more or fewer program loops than those shown in FIG. 9.

Figure 10:
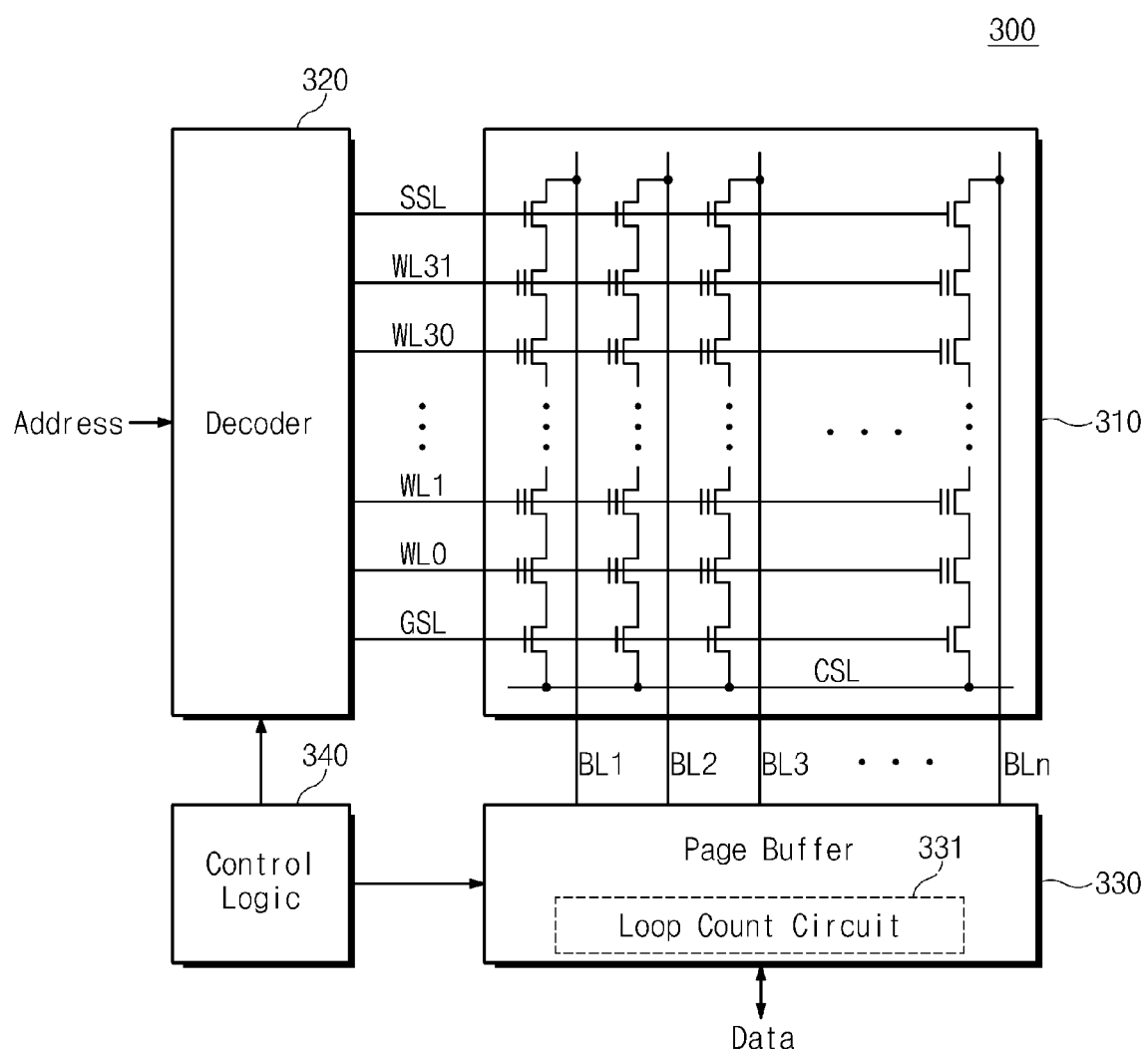
FIG. 10 is a block diagram illustrating a nonvolatile memory device in accordance with yet another embodiment of the inventive concept.

FIG. 10 is a block diagram illustrating a nonvolatile memory device 300 in accordance with still another embodiment of the inventive concept. Referring to FIG. 10, nonvolatile memory device 300 comprises a cell array 310, a decoder 320, a page buffer 330 and control logic 340. Cell array 310 and decoder 320 are similar to cell array 110 and decoder 120 in FIG. 1, and so a detail description of these features is omitted to avoid redundancy.

Page buffer 330 is connected to cell array 310 via bitlines BL1 through BLn. In a program operation of nonvolatile memory device 300, page buffer 330 receives program data from an external source and temporarily stores the received data while programming it to a selected page of cell array 310 via bitlines BL1 through BLn. During the program operation, page buffer 330 performs a series of program loops each comprising a step of applying a program voltage to memory cells of the selected page according to the value of the received data, and a step of applying a verification voltage to the memory cells of the selected page to determine whether the memory cells have been successfully programmed.

In a read operation of nonvolatile memory device 300, page buffer 330 senses data from a selected page of cell array 310 via bitlines BL1 through BLn and temporarily stores the sensed data before transmitting it to an external destination.

Page buffer 330 comprises a loop count circuit 331 that stores a loop count value indicating a number of program loops that have been performed on the selected page using the received data. Page buffer 330 activates or inactivates bitline precharging in verification operations of the program loops based on the value of loop count value. In particular, where the loop count value is less than a predetermined number, page buffer 330 inactivates bitline precharging, and where the loop count value is greater than or equal to the predetermined number, page buffer 330 activates bitline precharging. Page buffer 330 may also skip a program verification operation in some program loops based on a program operation mode.

Control logic 340 controls operations of nonvolatile memory device 300 such as a program, read, and erase operations. For example, control logic 340 controls decoder 320 so that a program voltage is provided to the selected wordline and controls page buffer 330 so that program data is provided to the selected page in a program operation.

As indicated above, nonvolatile memory device 300 activates bitline precharging in verification operations of some program loops, but not others. In verification operations where bitline precharging is activated, nonvolatile memory device 300 senses voltage changes on the precharged bitlines to determine whether selected memory cells have been successfully programmed.

Nonvolatile memory devices 100, 200, and 300 can be incorporated in a wide variety of products. For instance, nonvolatile memory devices 100, 200 and 300 can be incorporated in electronic devices such as personal computers, digital computers, camcorders, mobile phones, personal media players (PMPs), and personal digital assistants (PDAs), and storage devices such as memory cards, USB memories, and SSDs.

Figure 11:
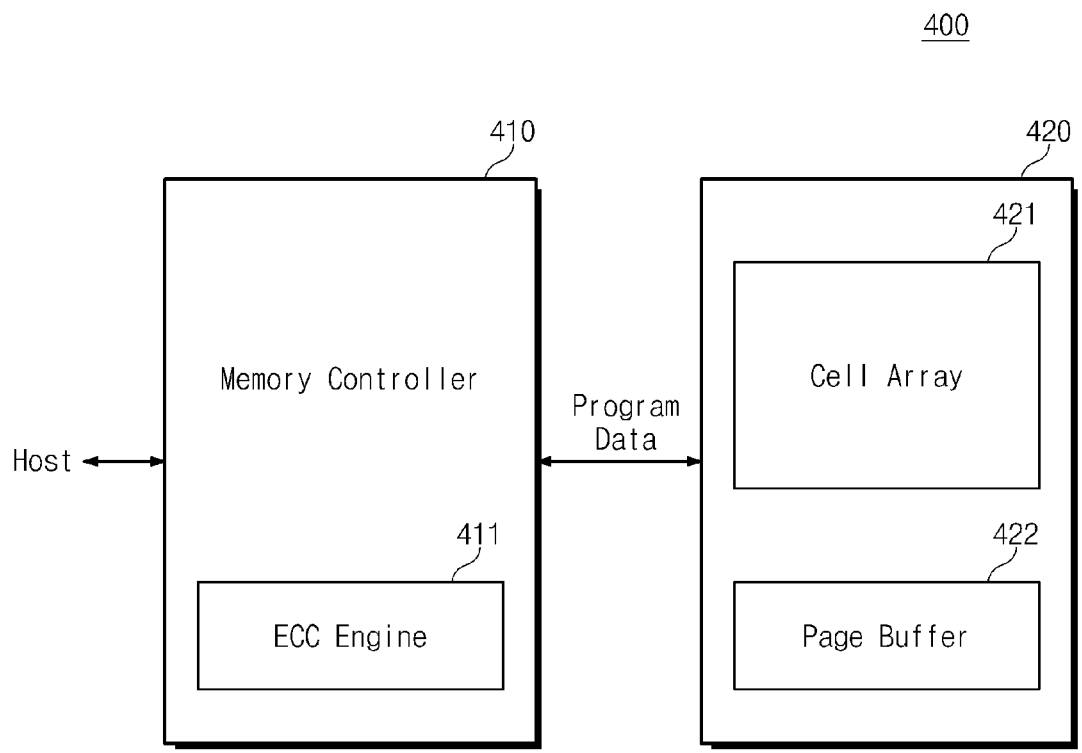
FIG. 11 is a block diagram illustrating a memory system in accordance with an embodiment of the inventive concept.

FIG. 11 is a block diagram illustrating a memory system 400 comprising a nonvolatile memory device 420 in accordance with an embodiment of the inventive concept. Referring to FIG. 11, memory system 400 comprises nonvolatile memory device 420 and a memory controller 410. Memory controller 410 comprises an ECC engine 411, and nonvolatile memory device 420 comprises a cell array 421 and a page buffer 422.

Memory controller 410 accesses nonvolatile memory device 420 in response to a read request or a program request from a host. In read operations, memory controller 410 detects whether there are any errors in data read from nonvolatile memory device 420. Where the data includes one or more errors, memory controller 410 executes an error correction operation to remove the errors using ECC engine 411.

In response to a program request from the host, memory controller 410 generates meta-data corresponding to data to be programmed in nonvolatile memory device 420. For example, ECC engine 411 generates meta-data corresponding to a page of data being programmed in nonvolatile memory device 420. The meta-data is provided to nonvolatile memory device 420 together with the page of data and is programmed in the same row. In read operations, ECC engine 411 performs error detection and correction using the meta-data.

In addition to the meta-data, memory controller 410 also generates a page property bit indicating whether the number of bits in a program page with logic level '1' or '0' exceeds a predetermined number. For example, in one embodiment, where the page has more than a certain number of bits with logic level '1', memory controller 410 sets the page property bit to '1', and otherwise, sets the page property bit to '0'. In other embodiments, the page property bit can be set to different logic levels based on the number of bits with logic level '1'.

Nonvolatile memory device 420 programs the selected page according to a first program mode or a second program mode based on the page property bit. The first program mode is an operation mode where bitline precharging is inactivated in program verification operations of some program loops. The second program mode is an operation mode where a precharge of a bitline is activated in all the program loops.

Where logic '1' exceeds the base value in a page to be programmed, it means that the number of memory cells which are program inhibited exceeds the base value. Accordingly, the number of memory cells that are targets of program and program verification operations is relatively small. Thus, nonvolatile memory device 420 programs the selected page according to the second program mode. Where logic '1' is below the base value in a page to be programmed, it means that the number of memory cells which are program inhibited is below the base value. That is, the number of memory cells that are targets of program and program verification operations is relatively large. In this scenario, where a program verification operation is performed, noise may increase by a bouncing of common source line CSL. Thus, nonvolatile memory device 420 programs the selected page according to the first program mode.

Figure 12:
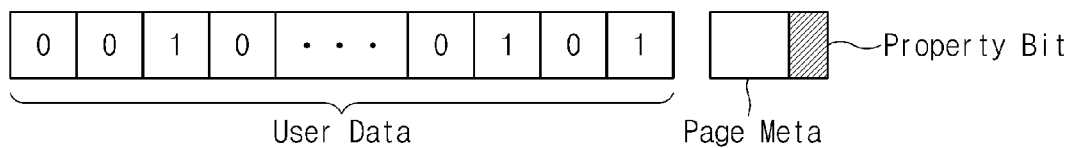
FIG. 12 is a block diagram illustrating program data of FIG. 11.

FIG. 12 is a block diagram illustrating a page of program data that can be programmed in memory system 400 of FIG. 11. Referring to FIG. 12, a page of data comprises user data and meta-data comprising control information regarding the user data. The meta-data may comprise, for instance, a property bit indicating a number of bits '1' or '0' in the user data. Such information can be computed and output by memory controller 410.

Memory controller 410 counts the number of bits with logic level '1' in a page of program data and determines whether the counted number of bits exceeds a predetermined value to determine a value of the property bit. The property bit is included in program data together with the meta-data and is provided to nonvolatile memory device 420.

Figure 13:
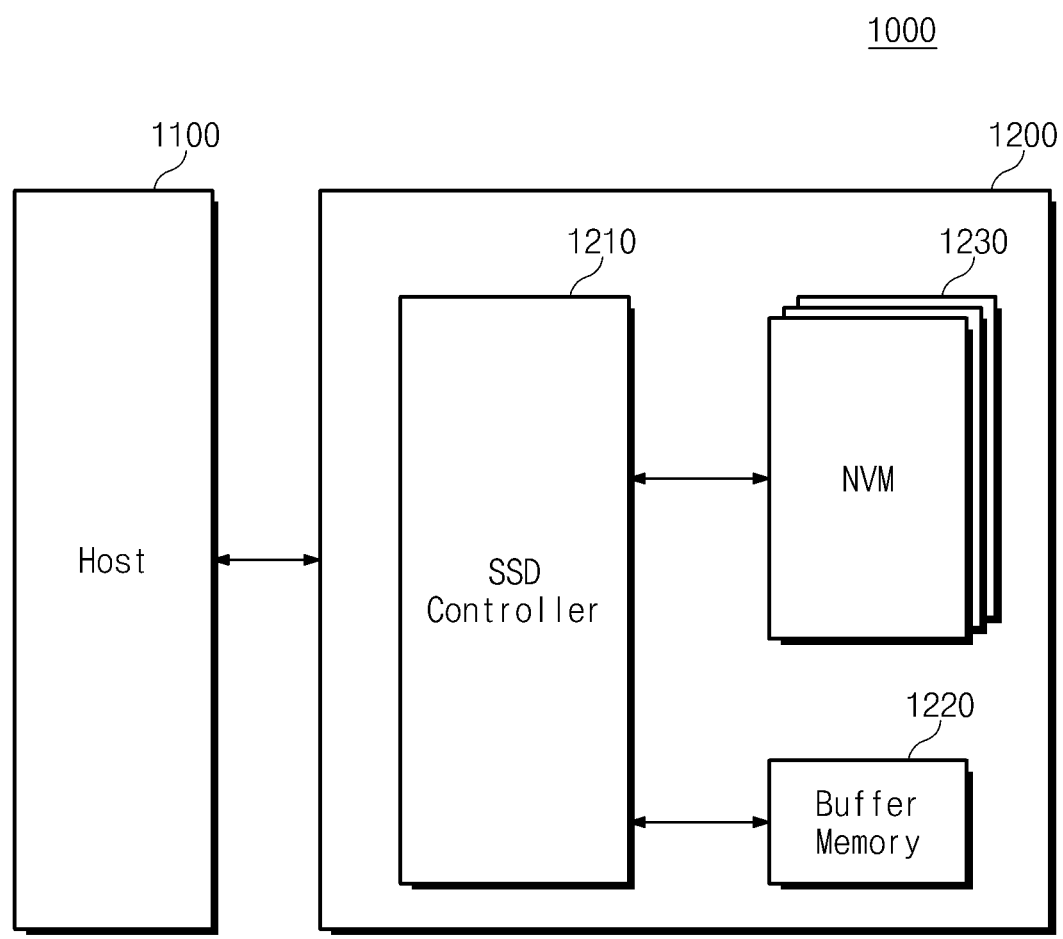
FIG. 13 is a block diagram illustrating a solid state drive (SSD) comprising a nonvolatile memory device in accordance with an embodiment of the inventive concept.

FIG. 13 is a block diagram illustrating an SSD comprising a nonvolatile memory device in accordance with an embodiment of the inventive concept. Referring to FIG. 13, an SSD system 1000 comprises a host 1100 and a SSD 1200. SSD 1200 comprises an SSD controller 1210, a buffer memory 1220 and a nonvolatile memory device 1230.

SSD controller 1210 provides a physical connection between host 1100 and SSD 1200 and comprises an interface compatible with a bus format of host 1100. SSD controller 1210 decodes a command provided from host 1100. SSD controller 1210 accesses nonvolatile memory device 1230 according to the decoded result. Host 1100 may use any of a variety of bus protocols for communication, such as universal serial bus (USB), small computer system interface (SCSI), PCI express, ATA, parallel ATA (PATA), serial ATA (SATA), and serial attached SCSI (SAS).

Buffer memory 1220 temporarily stores program data provided from host 1100 or data read from nonvolatile memory device 1230. Where data in memory device 1230 is cached and the host makes a read request, buffer memory 1220 can provide the cached data to host 1100 without accessing nonvolatile memory device 1230. Generally, a transmission speed of data by the bus format of host 1100 (for example, SATA or SAS) is much faster than a transmission speed of a memory channel of SSD 1200. That is, where an interface speed of host 1100 is relatively fast, deterioration of performance due to a speed difference can be minimized by providing a large amount of buffer memory 1220.

Buffer memory 1220 can comprise a synchronous DRAM to provide sufficient buffering in SSD 1200. However, buffer memory 1220 is not limited to using a synchronous DRAM.

Nonvolatile memory device 1230 is provided as a storage media of SSD 1200. In certain embodiments, nonvolatile memory device 1230 comprises a NAND-type flash memory having a large storage capacity. In other embodiments, nonvolatile memory device 1230 comprises more than one memory chip or unit, or a combination of different memory types. In some embodiments, nonvolatile memory device 1230 comprises a plurality of memory units connected to SSD controller 1210 by different channels. In some embodiments, nonvolatile memory device 1230 comprises one or more forms of nonvolatile memory other than NAND-type flash memory, such as a PRAM, a MRAM, a ReRAM, FRAM, NOR flash memory or the like may be used as a storage media, and a memory system in which different kinds of memory devices are mixed may be applied. The nonvolatile memory can also be supplemented by a volatile memory device, such as a DRAM.

In FIG. 13, nonvolatile memory device 1230 may be one or nonvolatile memory devices 100, 200 and 300 illustrated in FIGS. 1, 7 and 10. Accordingly, in certain program loops, nonvolatile memory device 1230 may skip a program verification operation or may skip only a precharge of a bitline when program verification is performed.

Figure 14:
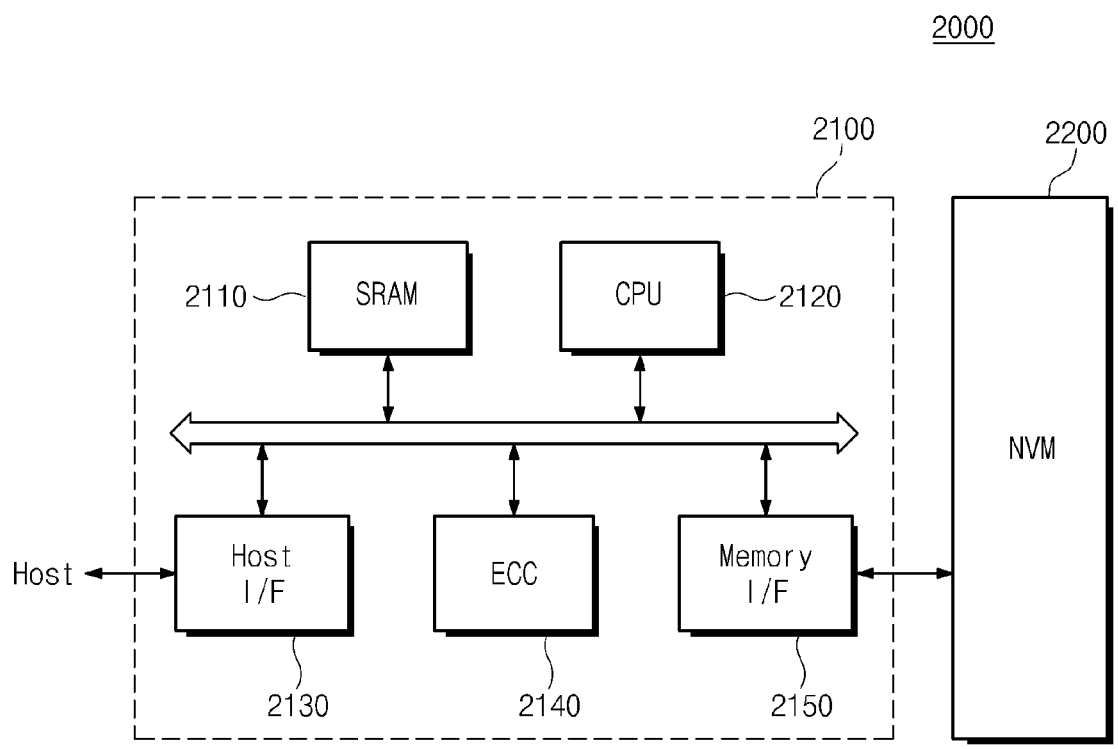
FIG. 14 is a block diagram illustrating a memory system comprising a nonvolatile memory device in accordance with an embodiment of the inventive concept.

FIG. 14 is a block diagram illustrating a memory system 2000 in accordance with an embodiment of the inventive concept. Referring to FIG. 14, memory system 2000 comprises a nonvolatile memory device 2200 and a memory controller 2100.

Nonvolatile memory device 2200 can comprise one of nonvolatile memory devices 100, 200 and 300 illustrated in FIGS. 1, 7, and 10. Memory controller 2100 is configured to control nonvolatile memory device 2200. In some embodiments, memory system 2000 forms a memory card or an SSD. An SRAM 2110 is used as an operation memory of a central processing unit 2120. A host interface 2130 comprises data exchange protocols of a host which is in contact with memory system 2000. An error correction block 2140 detects and corrects errors included in data read from nonvolatile memory device 2200. A memory interface 2150 interface with nonvolatile memory device 2200. Central processing unit 2120 performs every control operation to exchange data of memory controller 2100. Although not illustrated in the drawings, memory system 2000 may further comprise a ROM storing code data for interfacing with the host.

Nonvolatile memory device 2200 may be provided as a multi chip package comprised of a plurality of flash memory chips. Memory system 2000 may be provided as a storage media of high reliability having a low probability of an error occurrence. In particular, the flash memory device of the inventive concept may be included in a memory system such as an SSD. In this case, memory controller 2100 is configured to communicate with an external device such as a host through one of various interface protocols such as USB, MMC, PCI-E, SAS, SATA, PATA, SCSI, ESDI and IDE. Components for performing additional operations may be further included in memory controller 2100.

Figure 15:
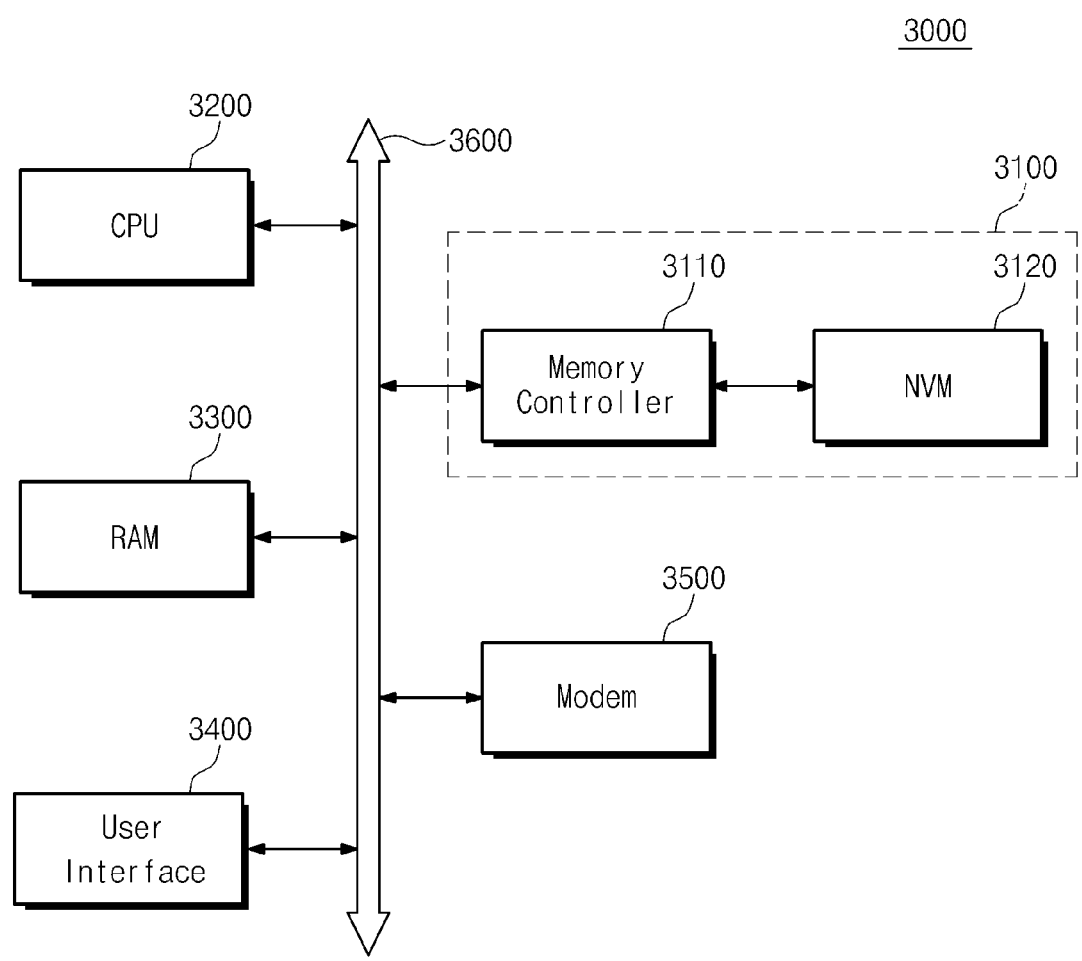
FIG. 15 is a block diagram illustrating a computing system comprising a nonvolatile memory device in accordance with an embodiment of the inventive concept.

FIG. 15 is a block diagram illustrating a computing system 3000 comprising a nonvolatile memory device 3120 in accordance with an embodiment of the inventive concept. Computing system 3000 comprises a microprocessor 3200, a RAM 3300, a user interface 3400, a modem 3500 such as a baseband chipset and a memory system 3100 electrically connected to a system bus 3600. Memory system 3100 is formed substantially identical to memory system 400 illustrated in FIG. 11. Where computing system 3000 comprises a mobile device, a battery may be used as a power supply. Although not illustrated in the drawings, an application chipset, a camera image processor (CIS), a mobile DRAM or the like may be further provided to computing system 3000. Memory system 3100 may, for example, constitute an SSD using a nonvolatile memory to store data. Memory system 3100 may be provided to be a fusion flash memory (e.g., a OneNAND flash memory).

The nonvolatile memory device and/or the memory controller may be mounted in various types of packages such as a package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP) and wafer-level processed stack package (WSP).

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the invention. Accordingly, all such modifications are intended to be included within the scope of the invention as defined in the claims. The invention is defined by the following claims, with equivalents of the claims to be included therein.

What is claimed is:

1. A method of programming selected memory cells of a nonvolatile memory device, comprising:
performing a first program loop comprising a first program operation and a first verify operation, wherein the first program operation comprises applying a first program pulse to a selected wordline connected to the selected memory cells and a first bitline voltage to first bitlines connected to the selected memory cells, wherein the first verify operation is a single verify operation performed without precharging the first bitlines; and
after the first program loop, performing a second program loop comprising a second program operation and a second verify operation, wherein the second program operation comprises applying a second program pulse having a magnitude higher than the first program pulse to the selected wordline and applying the first bitline voltage to the first bitlines, and the second verify operation is performed with precharging the first bitlines.

2. The method of claim 1, wherein the selected memory cells are programmed from an initial program state to an intermediate program state by performing at least one program loop without bitline precharging, and are programmed from the intermediate program state to a final program state by performing at least one program loop with bitline precharging.

3. The method of claim 2, wherein the intermediate state is a state where a magnitude of drain-source currents of the selected memory cells of is below a predetermined threshold value.

4. The method of claim 2, wherein the intermediate state is achieved by performing a predetermined number of the second program loops without precharging in accordance with a loop count value.

5. The method of claim 2, wherein the intermediate state is a state where a common source line connected to the selected memory cells has a current with a magnitude smaller than a predetermined value.

6. The method of claim 1, wherein the nonvolatile memory device is a multi-level cell flash memory device.

7. A nonvolatile memory device, comprising:
a memory cell;
a page buffer connected to a bitline of the memory cell and configured to store a loop count indicating a number of program loops performed in a program operation of the memory cell, wherein each program loop comprises a single program operation and a single program verification operation; and
control logic configured to inactivate precharging of the bitline during a program verification operation performed while the loop count is below a predetermined value, and further configured to activate precharging of the bitline during a program verification operation performed while the loop count stored in the page buffer is at or above the predetermined value.

8. The nonvolatile memory device of claim 7, wherein the page buffer comprises a plurality of latches to store the loop count.

9. The nonvolatile memory device of claim 8, wherein the control logic controls the plurality of latches to increment the loop count in successive program loops of the nonvolatile memory device.

10. The nonvolatile memory device of claim 8, further comprising a loop count circuit generating the loop count.

11. The nonvolatile memory device of claim 7, further comprising a decoder transmitting a program voltage or a verification voltage to a wordline of the memory cell.

12. The nonvolatile memory device of claim 11, wherein the control logic controls the decoder to cut off the verification voltage from the wordline during program verification operations performed while the loop count is below the predetermined value.

13. A method of programming a nonvolatile memory device, comprising:
selecting a programming mode of the nonvolatile memory device based on received input data;
where the selected programming mode is a first programming mode, performing a plurality of program loops to program a selected page of memory cells, wherein each of the program loops comprises a program verification operation performed with bitline precharging; and
where the selected programming mode is a second programming mode, performing a plurality of program loops to program the selected page of memory cells, wherein some of the program loops comprise a single program verification operation performed without bitline precharging and some of the program loops are performed subsequently with bitline precharging.

14. The method of claim 13, wherein the input data comprises a page of data to be programmed in the selected page of memory cells.

15. The method of claim 13, wherein selecting the programming mode comprises determining the number of bits with logic level '1' in the input data, and selecting the first programming mode where the determined number exceeds a predetermined value.

16. The method of claim 13, further comprising:
storing meta-data in the selected page of memory cells to indicate the selected programming mode.

17. The method of claim 13, wherein the nonvolatile memory device comprises a multi-level cell flash memory device.

18. A method of programming selected memory cells of a nonvolatile memory device, comprising:
performing a first program loop comprising a first program operation and a first verify operation, wherein the first program operation applying a first program pulse to a selected wordline connected to the selected memory cells and a first bitline voltage to first bitlines connected to the selected memory cells, wherein the first verify operation is a single verify operation performed without precharging the first bitlines for sensing threshold voltage of the selected memory cells;
after the first program loop, performing a second program loop comprising a second program operation and a second verify operation, wherein the second program operation comprises-applying a second program pulse of which the magnitude is higher than the first program pulse to the selected wordline and applying the first bitline voltage to the first bitlines, wherein the second verify operation is a single verify operation performed without precharging the first bitlines or skipped; and
performing a third program loop comprising a third program operation and a third verify operation, wherein the third program operation comprises applying a third program pulse having magnitude higher than the second program pulse to the selected wordline and the first bitline voltage to the first bitlines, wherein the third verify operation performed with precharging the first bitlines, wherein the first bitline voltage is lower than a program inhibit voltage.

19. The method of claim 18, wherein a verification voltage is not provided to the selected wordline during the second verify operation.

* * * * *